United States Patent
Chung (10) Patent No.: US 7,865,543 B2
(45) Date of Patent: Jan. 4, 2011

(54) OFFSET COMPENSATION FOR RAIL-TO-RAIL AVERERAGING CIRCUIT

(75) Inventor: Kyu-Young Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1021 days.

(21) Appl. No.: 11/653,753

(22) Filed: Jan. 16, 2007

(65) Prior Publication Data

US 2008/0077347 A1  Mar. 27, 2008

(30) Foreign Application Priority Data

Sep. 27, 2006  (KR) ...................... 10-2006-0094085

(51) Int. Cl.
*G06G 7/12* (2006.01)
*G06F 7/38* (2006.01)

(52) U.S. Cl. ...................................... 708/805; 708/445

(58) Field of Classification Search ................. 708/445, 708/805

See application file for complete search history.

(56) References Cited

U.S. PATENT DOCUMENTS

| 5,469,106 A | 11/1995 | Dow ........................... 330/254 |
| 6,437,630 B1 * | 8/2002 | Gilbert ........................ 327/348 |
| 6,963,244 B1 | 11/2005 | Carter .......................... 330/252 |

\* cited by examiner

*Primary Examiner*—Tan V Mai
(74) *Attorney, Agent, or Firm*—Monica H. Choi (57) ABSTRACT

An averaging circuit includes an averaging unit and an offset compensation unit. The averaging unit generates an average signal from first and second input signals. The offset compensating unit is coupled to the averaging unit for conducting away bias currents from the averaging unit for preventing an offset in the average signal when any of the first and second input signals is too low or too high.

24 Claims, 8 Drawing Sheets

OFFSET COMPENSATION FOR RAIL-TO-RAIL AVERERAGING CIRCUIT

CROSS-REFERENCE TO RELATED APPLICATION(S)

The present application claims priority under 35 U.S.C. §119 to Korean Patent Application No. 2006-94085, filed on Sep. 27, 2006, which is incorporated herein by reference in its entirety.

TECHNICAL FIELD

The present invention relates generally to averaging circuits, and more particularly, to offset compensation in a rail-to-rail averaging circuit.

BACKGROUND OF THE INVENTION

Figure 1:
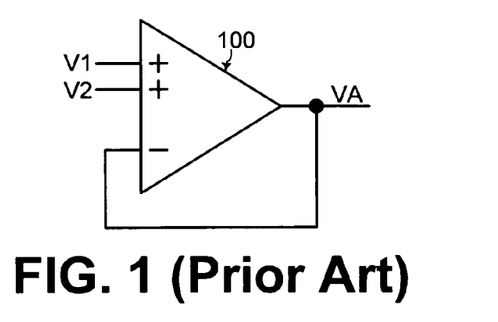
FIG. 1 shows a block diagram representation of an averaging circuit, according to the prior art.

FIG. 1 shows a block diagram representation of an averaging circuit 100 as known in the prior art. The averaging circuit 100 inputs first and second input voltage signals V1 and V2 and generates an average voltage signal VA that is an average of the input voltage signals V1 and V2 as follows:

$$VA=(V1+V2)/2.$$

Figure 2:
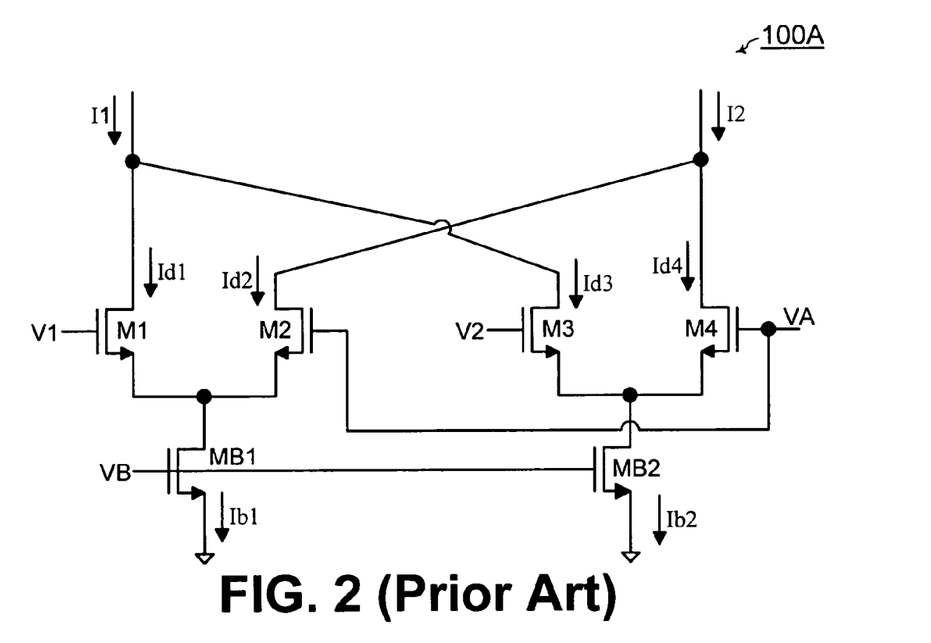
FIG. 2 shows a circuit diagram of an example averaging circuit including NMOSFETs, according to the prior art.

FIG. 2 shows a circuit diagram of an example averaging circuit 100A formed with NMOSFETs (N-channel metal oxide semiconductor field effect transistors) according to the prior art. The example averaging circuit 100A includes a first NMOSFET M1, a second NMOSFET M2, a third NMOSFET M3, a fourth NMOSFET M4, a fifth NMOSFET MB1, and a sixth NMOSFET MB2.

The first and second NMOSFETs M1 and M2 are differentially coupled with the sources of the NMOSFETs M1 and M2 being coupled together to the fifth NMOSFET MB1 that provides a bias current Ib1. The third and fourth NMOSFETs M3 and M4 are differentially coupled with the sources of the NMOSFETs M3 and M4 being coupled together to the sixth NMOSFET MB2 that provides a bias current Ib2.

The first input voltage signal V1 is applied at a gate of the first NMOSFET M1, and the second input voltage signal V2 is applied at a gate of the third NMOSFET M3. The first and second NMOSFETs M1 and M2 are matched transistors, and the third and fourth NMOSFETs M3 and M4 are matched transistors. The fifth and sixth NMOSFETs MB1 and MB2 are matched transistors and have gates with a bias voltage VB applied thereon.

In that case, Ib1=Ib2. In addition, I1 which is a sum of the drain currents Id1 and Id3 through the first and third NMOSFETs M1 and M3, respectively, is equal to I2 which is a sum of the drain currents Id2 and Id4 through the second and fourth NMOSFETs M2 and M4, respectively. In this manner, if the transconductances gm1 and gm3 of the first and third NMOSFETs M1 and M3 are substantially equal, the average voltage signal VA is generated at the gates of the second and fourth NMOSFETs M2 and M4.

However, because only NMOSFETs are used in the averaging circuit 100A of FIG. 2, when V1 or V2 is lower than (Vth+ΔM1+ΔMB1), Ib1 may no longer be equal to Ib2. Vth is the threshold voltage of transistor M1, ΔM1 is a minimum drain to source saturation voltage of transistor M1, and ΔMB1 is a drain to source voltage of transistor MB1. Furthermore, if V1 or V2 is further lowered, then any of NMOSFETs M1, M2, M3, and M4 may be turned off. Thus, the averaging circuit 100A of FIG. 2 operates improperly for low values of V1 or V2.

Figure 3:
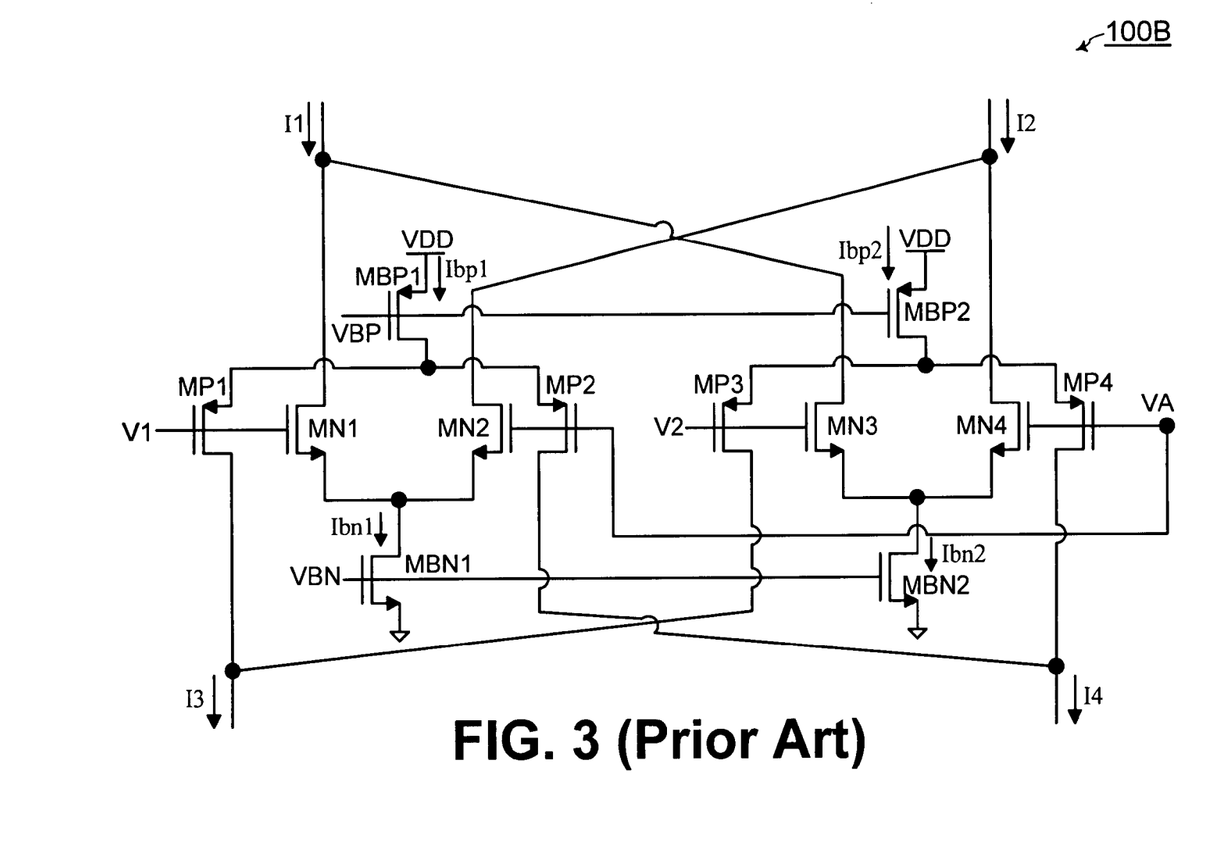
FIG. 3 shows a circuit diagram of an example averaging circuit including NMOSFETs and PMOSFETs for rail-to-rail voltage swing, according to the prior art.

FIG. 3 shows a circuit diagram of another example averaging circuit 100B having NMOSFETs and PMOSFETs (P-channel metal oxide semiconductor field effect transistors) for rail-to-rail operation of the input voltage signals V1 and V2. The averaging circuit 100B of FIG. 3 includes first, second, third, fourth, fifth, and sixth NMOSFETs MN1, MN2, MN3, MN4, MBN1, and MBN2 configured similarly as the NMOSFETs of FIG. 2.

In addition, the averaging circuit 100B of FIG. 3 also includes first, second, third, fourth, fifth, and sixth PMOSFETs MP1, MP2, MP3, MP4, MBP1, and MBP2. The first and second PMOSFETs MP1 and MP2 are differentially coupled with the sources of the PMOSFETs MP1 and MP2 being coupled together to the fifth PMOSFET MBP1 that provides a bias current Ibp1 for the PMOSFETs MP1 and MP2. The third and fourth PMOSFETs MP3 and MP4 are differentially coupled with the sources of the PMOSFETs MP3 and MP4 being coupled together to the sixth PMOSFET MBP2 that provides a bias current Ibp2 for the PMOSFETs MP3 and MP4.

The first input voltage signal V1 is applied at gates of the first NMOSFET and PMOSFET MN1 and MP1, and the second input voltage signal V2 is applied at gates of the third NMOSFET and PMOSFET MN3 and MP3. The first and second NMOSFETs MN1 and MN2 are matched transistors, and the third and fourth NMOSFETs MN3 and MN4 are matched transistors. The fifth and sixth NMOSFETs MBN1 and MBN2 are matched transistors and have gates with a first bias voltage VBN applied thereon.

The first and second PMOSFETs MP1 and MP2 are matched transistors, and the third and fourth PMOSFETs MP3 and MP4 are matched transistors. The fifth and sixth PMOSFETs MBP1 and MBP2 are matched transistors and have gates with a second bias voltage VBP applied thereon.

In addition, I1 which is a sum of the drain currents through the first and third NMOSFETs MN1 and MN3 is equal to I2 which is a sum of the drain currents through the second and fourth NMOSFETs MN2 and MN4. Furthermore, I3 which is a sum of the drain currents through the first and third PMOSFETs MP1 and MP3 is equal to I4 which is a sum of the drain currents through the second and fourth PMOSFETs MP2 and MP4.

The transconductances gmn1 and gmn3 of the first and third NMOSFETs MN1 and MN3 are substantially equal, and the transconductances gmp1 and gmp3 of the first and third PMOSFETs MP1 and MP3 are substantially equal. In that case, the average voltage signal VA is generated at the gates of the second and fourth NMOSFETs MN2 and MN4 and the second and fourth PMOSFETs MP2 and MP4.

The NMOSFETs MN1, MN2, MN3, MN4, MBN1, and MBN2 operate for the higher levels of the input voltage signals V1 and V2. The PMOSFETs MP1, MP2, MP3, MP4, MBP1, and MBP2 operate for the lower levels of the input voltage signals V1 and V2. Thus, the averaging circuit 100B of FIG. 3 operates for the rail-to-rail voltage range of VDD to GND (ground) with VDD being applied at the sources of the bias PMOSFETs MBP1 and MBP2 and with GND being applied at the sources of the bias NMOSFETs MBN1 and MBN2.

However, an offset is generated in the average voltage signal VA for the averaging circuit 100B of FIG. 3 for some values of V1 and V2. For example, assume that V2<(Vthn+Δn3+Δnb2) with Vthn being the NMOSFET threshold voltage, Δn3 being a minimum drain to source saturation voltage of NMOSFET MN3, and Δnb2 being a drain to source voltage of NMOSFET MBN2. In addition, assume that V1<(Vthn+Δn1+Δnb1) with Vthn being the NMOSFET threshold voltage, Δn1 being a minimum drain to source saturation voltage of NMOSFET MN1, and Δnb1 being a drain to source voltage of NMOSFET MBN1.

In that first case, NMOSFETs MN1 and MBN1 operate in saturation, but NMOSFETs MN3 and MBN2 operate in the linear or cut-off region. Thus, a bias current Ibn2 through the bias NMOSFET MBN2 is decreasing. To maintain I1=I2, the average voltage signal VA is increased to be higher than (V1+V2)/2.

In another example, assume that V2<Vthn and that Vthn<V1<(Vthn+Δn1+Δnb1). In that second case, MN1 and MBN1 are not operating in saturation, but a small level of the bias current Ibn1 through the bias NMOSFET MBN1 exists. In addition, the NMOSFETs MN3 and MBN2 are in the cut-off region. To maintain I1=I2, the average voltage signal VA is increased to be higher than (V1+V2)/2.

In a further example, assume that V2<VDD−(Vthp+Δp3+Δpb2) with Vthp being the PMOSFET threshold voltage, Δp3 being a minimum source to drain saturation voltage of PMOSFET MP3, and Δpb2 being a source to drain voltage of PMOSFET MBP2. In addition, assume that V1>VDD−(Vthp+Δp1+Δpb1) with Vthp being the PMOSFET threshold voltage, Δp1 being a minimum source to drain saturation voltage of PMOSFET MP1, and Δpb1 being a source to drain voltage of PMOSFET MBP1.

In that third case, PMOSFETs MP3 and MBP2 operate in saturation, but PMOSFETs MP1 and MBP1 operate in the linear or cut-off region. Thus, a bias current Ibp1 through the bias PMOSFET MBP1 is decreasing. To maintain I1=I2, the average voltage signal VA is decreased to be lower than (V1+V2)/2.

In another example, assume that [VDD−(Vthp+Δp3+Δpb2)]<V2<(VDD−Vthp) and that V1>(VDD−Vthp). In that fourth case, MP3 and MBP2 are not operating in saturation, but a small level of the bias current Ibp2 through the bias PMOSFET MBP2 exists. In addition, the PMOSFETs MP1 and MBP1 are in the cut-off region. To maintain I1=I2, the average voltage signal VA is decreased to be lower than (V1+V2)/2.

Figure 4:
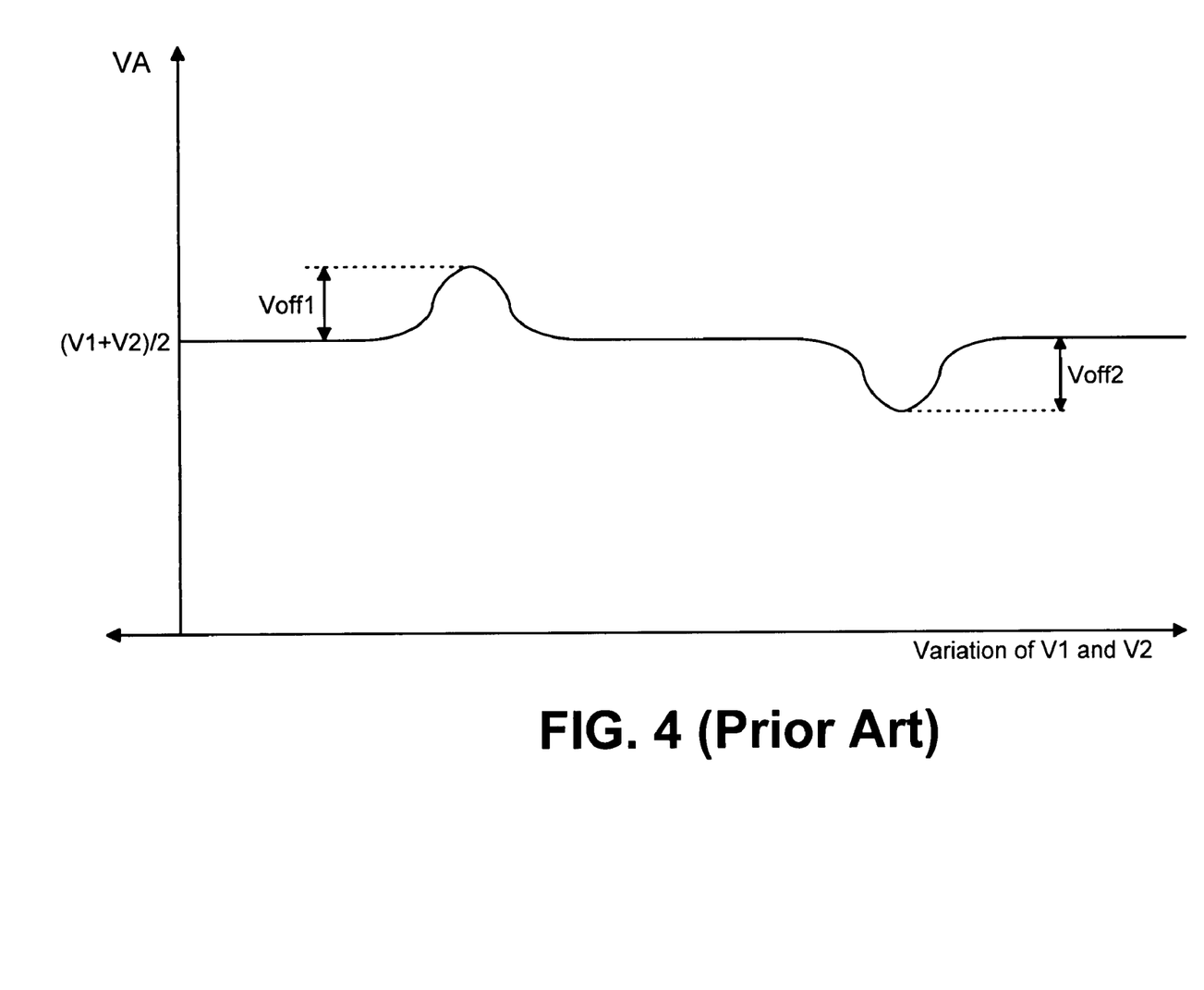
FIG. 4 shows a voltage diagram for illustrating offset generated in an average signal for the averaging circuit of FIG. 3, according to the prior art.

FIG. 4 illustrates the positive offset Voff1 in the average voltage signal VA generated in FIG. 3 for the first and second example cases described above for lower values of an input voltage signal V1 or V2. FIG. 4 also illustrates the negative offset Voff2 in the average voltage signal VA generated in FIG. 3 for the third and fourth example cases described above for higher values of an input voltage signal V1 or V2.

Thus, a mechanism is desired for eliminating such offsets Voff1 and Voff2 to the average voltage signal VA in the rail-to-rail averaging circuit.

SUMMARY OF THE INVENTION

Accordingly, in a general aspect of the present invention, an averaging circuit includes offset compensation for eliminating offset in the generated average signal.

An averaging circuit according to a general aspect of the present invention includes an averaging unit and an offset compensation unit. The averaging unit generates an average signal from first and second input signals. The offset compensating unit is coupled to the averaging unit for conducting away a bias current from the averaging unit for preventing an offset in the average signal.

In an example embodiment of the present invention, the averaging unit includes first, second, and third sets of field effect transistors. The first set of field effect transistors has gates with the first input signal applied thereon, and the second set of field effect transistors has gates with the second input signal applied thereon. The third set of field effect transistors has gates with the average signal generated thereon.

In another embodiment of the present invention, the offset compensating unit includes first and second offset compensators. The first offset compensator conducts a first bias current away from the third set of field effect transistors when the first input signal is less than a first predetermined level for preventing a positive offset in the average signal. The second offset compensator conducts a second bias current away from the third set of field effect transistors when the second input signal is higher than a second predetermined level for preventing a negative offset in the average signal.

In a further embodiment of the present invention, the offset compensating unit includes third and fourth offset compensators. The third offset compensator conducts the first bias current away from the third set of field effect transistors when the second input signal is less than the first predetermined level for preventing a positive offset in the average signal. The fourth offset compensator conducts the second bias current away from the third set of field effect transistors when the first input signal is higher than the second predetermined level for preventing a negative offset in the average signal.

In this manner, the offset compensators eliminate offset in the average signal. In addition, the averaging unit and the offset compensators are implemented with NMOSFETs and PMOSFETs for rail-to-rail voltage swing of the averaging circuit.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, and 9 refer to elements having similar structure and/or function.

DETAILED DESCRIPTION

Figure 5:
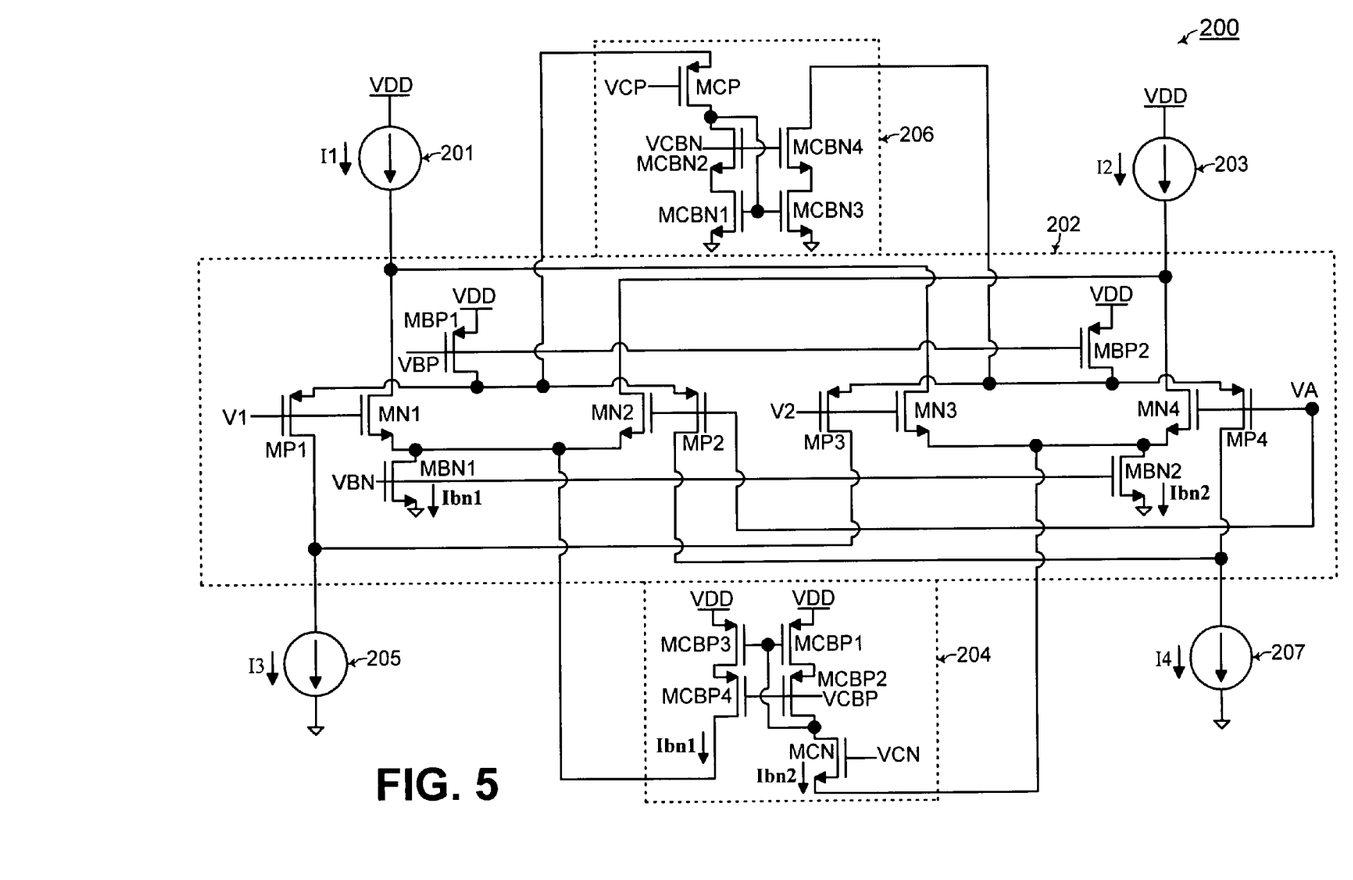
FIG. 5 shows a circuit diagram of an averaging circuit with offset compensators conducting away NMOSFET bias currents, according to an embodiment of the present invention.

FIG. 5 shows a circuit diagram of an averaging circuit 200 with offset compensation according to an embodiment of the present invention. The averaging circuit 200 includes an averaging unit 202, a first offset compensator 204, and a second offset compensator 206 (each shown in dashed lines in FIG. 5). The first and second offset compensators 204 and 206 form an offset compensating unit for substantially eliminating offset in an average signal VA generated by the averaging circuit 200.

The averaging circuit 200 generates the average signal VA that is an average of two input signals V1 and V2. The averaging unit 202 is implemented with NMOSFETs (N-channel metal oxide semiconductor field effect transistors) and PMOSFETs (P-channel metal oxide semiconductor field effect transistors) for a rail-to-rail averaging circuit 200 that operates for a range of VDD (a high power supply voltage) to GND (a ground voltage) for the input signals V1 and V2.

The averaging unit 202 includes first, second, third, fourth, fifth, and sixth NMOSFETs MN1, MN2, MN3, MN4, MBN1, and MBN2, respectively. The first and second NMOSFETs MN1 and MN2 are differentially coupled with sources of such NMOSFETs MN1 and MN2 being coupled together to the fifth NMOSFET MBN1 (i.e., a first bias NMOSFET) that provides a bias current Ibn1. The third and fourth NMOSFETs MN3 and MN4 are differentially coupled with sources of such NMOSFETs MN3 and MN4 being coupled together to the sixth NMOSFET MBN2 (i.e., a second bias NMOSFET) that provides a bias current Ibn2.

The averaging unit 202 also includes first, second, third, fourth, fifth, and sixth PMOSFETs MP1, MP2, MP3, MP4, MBP1, and MBP2, respectively. The first and second PMOSFETs MP1 and MP2 are differentially coupled with sources of such PMOSFETs MP1 and MP2 being coupled together to the fifth PMOSFET MBP1 (i.e., a first bias PMOSFET) that provides a bias current Ibp1. The third and fourth PMOSFETs MP3 and MP4 are differentially coupled with sources of such PMOSFETs MP3 and MP4 being coupled together to the sixth PMOSFET MBP2 (i.e., a second bias PMOSFET) that provides a bias current Ibp2.

The first input voltage signal V1 is applied at the gates of the first NMOSFET MN1 (i.e., a first input NMOSFET) and the first PMOSFET MP1 (i.e., a first input PMOSFET) that form a first set of field effect transistors. The second input voltage signal V2 is applied at the gates of the third NMOSFET M2 (i.e., a second input NMOSFET) and the third PMOSFET MP2 (i.e., a second input PMOSFET) that form a second set of field effect transistors.

The first and second NMOSFETs MN1 and MN2 are matched transistors, and the third and fourth NMOSFETs MN3 and MN4 are matched transistors. The fifth and sixth NMOSFETs MBN1 and MBN2 are matched transistors and have gates with a first bias voltage VBN applied thereon. The first and second PMOSFETs MP1 and MP2 are matched transistors, and the third and fourth PMOSFETs MP3 and MP4 are matched transistors. The fifth and sixth PMOSFETs MBP1 and MBP2 are matched transistors and have gates with a second bias voltage VBP applied thereon.

In addition, I1 which is a sum of the drain currents through the first and third NMOSFETs MN1 and MN3 is equal to I2 which is a sum of the drain currents through the second and fourth NMOSFETs MN2 and MN4. The drains of the first and third NMOSFETs MN1 and MN3 are coupled to a first N-type current source 201 that provides the current I1, and the drains of the second and fourth NMOSFETs MN2 and MN4 are coupled to a second N-type current source 203 that provides the current I2. In one embodiment of the present invention, the first and second N-type current sources 201 and 203 may be implemented as current mirror loads. Current mirror loads individually and generally are known to one of ordinary skill in the art.

Furthermore, I3 which is a sum of the drain currents through the first and third PMOSFETs MP1 and MP3 is equal to I4 which is a sum of the drain currents through the second and fourth PMOSFETs MP2 and MP4. The drains of the first and third PMOSFETs MP1 and MP3 are coupled to a first P-type current source 205 that provides the current I3, and the drains of the second and fourth PMOSFETs MP2 and MP4 are coupled to a second P-type current source 207 that provides the current I4. In one embodiment of the present invention, the first and second P-type current sources 205 and 207 may be implemented as current mirror loads.

The transconductances gmn1 and gmn3 of the first and third NMOSFETs MN1 and MN3, respectively, are substantially equal, and the transconductances gmp1 and gmp3 of the first and third PMOSFETs MP1 and MP3, respectively, are substantially equal. In that case, the average voltage signal VA is generated at the gates of the second and fourth NMOSFETs MN2 and MN4 (i.e., first and second output NMOSFETs) and the second and fourth PMOSFETs MP2 and MP4 (i.e., first and second output PMOSFETs) that form a third set of field effect transistors.

When the transconductances gmn1 and gmn3 are substantially equal and the transconductances gmp1 and gmp3 are substantially equal, the average voltage signal VA is a sum of ½ of V1 and ½ of V2 as follows:

$$VA=(V1+V2)/2.$$

However, the present invention may also be practiced when the average voltage signal VA is a sum of respective different weighted coefficients of V1 and V2 as follows when such transconductances are not equal:

$$VA=[gmn1*V1/(gmn1+gmn3)]+[gmn3*V2/(gmn1+gmn3)]$$

The NMOSFETs MN1, MN2, MN3, MN4, MBN1, and MBN2 operate for the higher levels of the input voltage signals V1 and V2. The PMOSFETs MP1, MP2, MP3, MP4, MBP1, and MBP2 operate for the lower levels of the input voltage signals V1 and V2. Thus, the averaging circuit 200 of FIG. 5 operates for the rail-to-rail voltage range of VDD to GND (ground) with VDD being applied at the sources of the bias PMOSFETs MBP1 and MBP2 and with GND being applied at the sources of the bias NMOSFETs MBN1 and MBN2.

The first offset compensator 204 includes first, second, third, and fourth cascode bias PMOSFETs MCBP1, MCBP2, MCBP3, and MCBP4 forming a diode-connected cascode current mirror and includes a compensating NMOSFET MCN. The source of the first bias PMOSFET MCBP1 has the high power supply voltage VDD applied thereon. The drain of the first bias PMOSFET MCBP1 is coupled to the source of the second bias PMOSFET MCBP2. The drain of the second bias PMOSFET MCBP2 is coupled to the drain of the compensating NMOSFET MCN. The source of the compensating NMOSFET MCN is coupled to the sources of the third and fourth NMOSFETs MN3 and MN4 of the averaging unit 202.

The source of the third bias PMOSFET MCBP3 has the high power supply voltage VDD applied thereon. The drain of the third bias PMOSFET MCBP3 is coupled to the source of the fourth bias PMOSFET MCBP4. The drain of the fourth bias PMOSFET MCBP4 is coupled to the sources of the first and second NMOSFETs MN1 and MN2 of the averaging unit 202.

The gates of the first and third bias PMOSFETs MCBP1 and MCBP3 are coupled together to the drain of the compensating NMOSFET MCN. The gate of the compensating NMOSFET MCN has a first predetermined bias voltage VCN applied thereon. The gates of the second and fourth bias PMOSFETs MCBP2 and MCBP4 have a first cascode voltage bias VCBP applied thereon.

The second offset compensator 206 includes first, second, third, and fourth cascode bias NMOSFETs MCBN1, MCBN2, MCBN3, and MCBN4 forming a diode-connected cascode current mirror and includes a compensating PMOSFET MCP. The source of the first bias NMOSFET MCBN1 has the ground voltage GND applied thereon. The drain of the first bias NMOSFET MCBN1 is coupled to the source of the second bias NMOSFET MCBN2. The drain of the second bias NMOSFET MCBN2 is coupled to the drain of the compensating PMOSFET MCP. The source of the compensating PMOSFET MCP is coupled to the sources of the first and second PMOSFETs MP1 and MP2 of the averaging unit 202.

The source of the third bias NMOSFET MCBN3 has the ground voltage GND applied thereon. The drain of the third bias NMOSFET MCBN3 is coupled to the source of the fourth bias NMOSFET MCBN4. The drain of the fourth bias NMOSFET MCBN4 is coupled to the sources of the third and fourth PMOSFETs MP3 and MP4 of the averaging unit 202.

The gates of the first and third bias NMOSFETs MCBN1 and MCBN3 are coupled together to the drain of the compensating PMOSFET MCP. The gate of the compensating PMOSFET MCP has a second predetermined bias voltage VCP applied thereon. The gates of the second and fourth bias NMOSFETs MCBN2 and MCBN4 have a second cascode voltage bias VCBN applied thereon.

In addition, the first predetermined bias voltage level VCN satisfies a following relationship:

$VCN > [\sqrt{2 \cdot L \cdot Ibn/(k' \cdot W)}] + \Delta nb + Vth,n,$ with sqrt being a square root function, L being a length of the compensating NMOSFET MCN, Ibn being the current Ibn2 through the second bias NMOSFET MBN2, k' being the mobility capacitance parameter of the compensating NMOSFET MCN, W being a width of the compensating NMOSFET MCN, Δnb being a saturation voltage of the second bias NMOSFET MBN2, and Vth,n being a threshold voltage of the compensating NMOSFET MCN.

Furthermore, the second predetermined bias voltage level VCP satisfies a following relationship:

$VCP < VDD - \Delta pb - |Vth,p| - [\sqrt{2 \cdot L \cdot Ibp/(k' \cdot W)}]$ with sqrt being a square root function, VDD being the high power supply voltage applied on the first bias PMOSFET MBP1, L being a length of the compensating PMOSFET MCP, Ibp being the bias current Ibp1 through the first bias PMOSFET MBP1, k' being a mobility capacitance parameter of the compensating PMOSFET MCP, W being a width of the compensating PMOSFET MCP, Δpb being a saturation voltage of the first bias PMOSFET MBP1, and Vth,p being a threshold voltage of the compensating PMOSFET MCP.

The averaging circuit 200 operates with V1>V2. When V2 is lower than the first predetermined bias voltage level VCN, the compensating NMOSFET MCN turns on. In addition, by current mirroring, the cascode bias PMOSFETs MCBP1, MCBP2, MCBP3, and MCBP4 of the first compensator 204 turn on.

Thus, the bias current Ibn1 flowing through the first bias NMOSFET MBN1 of the averaging unit 202 is diverted through the cascode bias PMOSFETs MCBP3 and MCBP4 of the first compensator 204. In addition, the bias current Ibn2 flowing through the second bias NMOSFET MBN2 of the averaging unit 202 is diverted through the cascode bias PMOSFETs MCBP1 and MCBP2 of the first compensator 204.

Thus, the NMOSFETs MN1, MN2, MN3, and MN4 are turned off when V2 is lower than the first predetermined bias voltage level VCN. In that case, the averaging circuit 200 depends on operation of the PMOSFETs MP1, MP2, MP3, MP4, MBP1 and MBP2 such that offset to the averaging signal VA is prevented.

Figure 6:
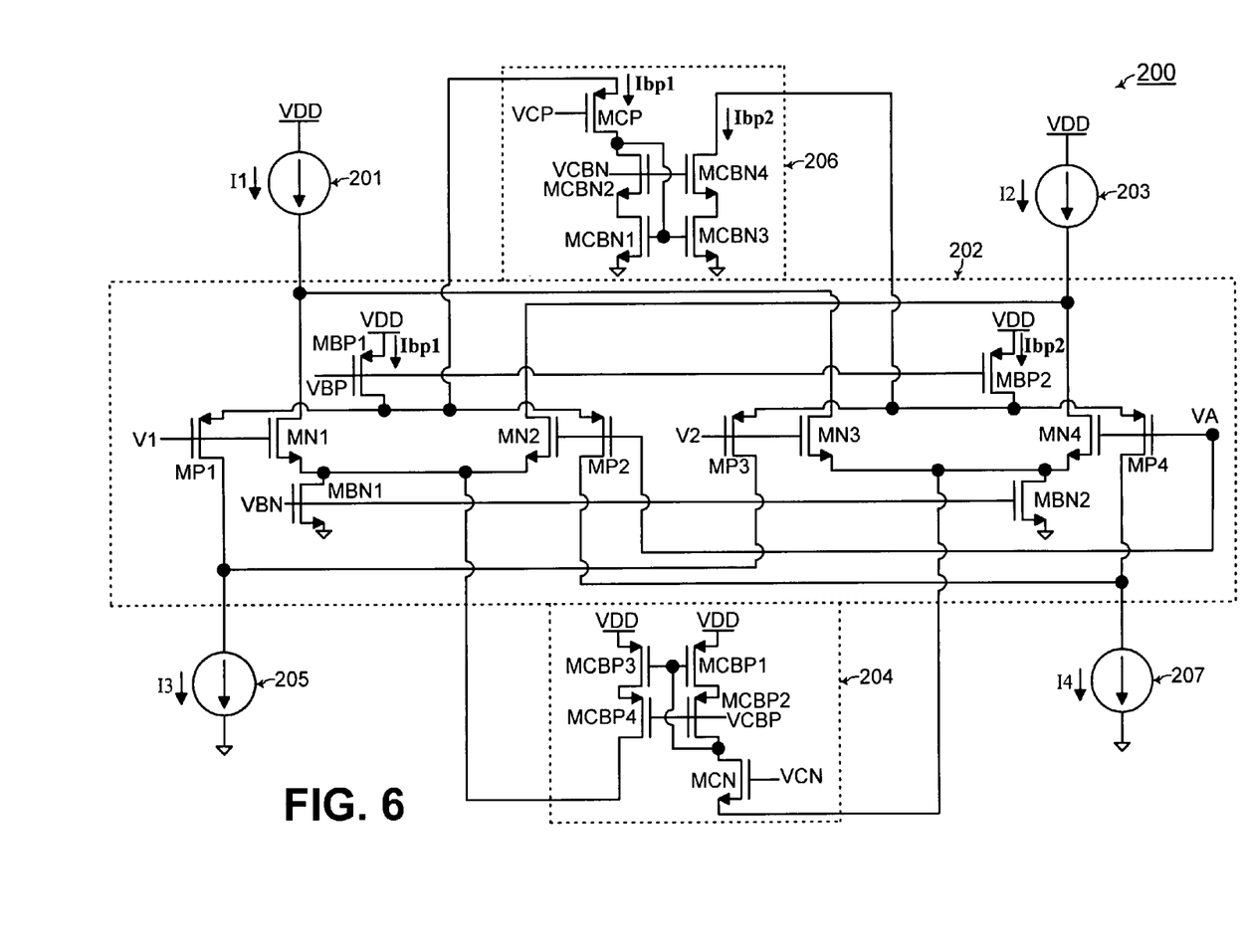
FIG. 6 shows the circuit diagram of FIG. 5 with the offset compensators conducting away PMOSFET bias currents, according to another embodiment of the present invention.

FIG. 6 illustrates the averaging circuit 200 of FIG. 5 for the case when the first input signal V1 is greater than the second predetermined bias voltage level VCP. In that case, the compensating PMOSFET MCP turns on. In addition, by current mirroring, the cascode bias NMOSFETs MCBN1, MCBN2, MCBN3, and MCBN4 of the second compensator 206 turn on.

Thus, the bias current Ibp1 flowing through the first bias PMOSFET MBP1 of the averaging unit 202 is diverted through the cascode bias NMOSFETs MCBN1 and MCBP1 of the second compensator 206. In addition, the bias current Ibp2 flowing through the second bias PMOSFET MBP2 of the averaging unit 202 is diverted through the cascode bias NMOSFETs MCBN3 and MCBN4 of the second compensator 206.

Thus, the PMOSFETs MP1, MP2, MP3, and MP4 are turned off when V1 is higher than the second predetermined bias voltage level VCP. In that case, the averaging circuit 200 depends on operation of the NMOSFETs MN1, MN2, MN3, MN4, MBN1 and MBN2 such that offset to the averaging signal VA is prevented.

Figure 7:
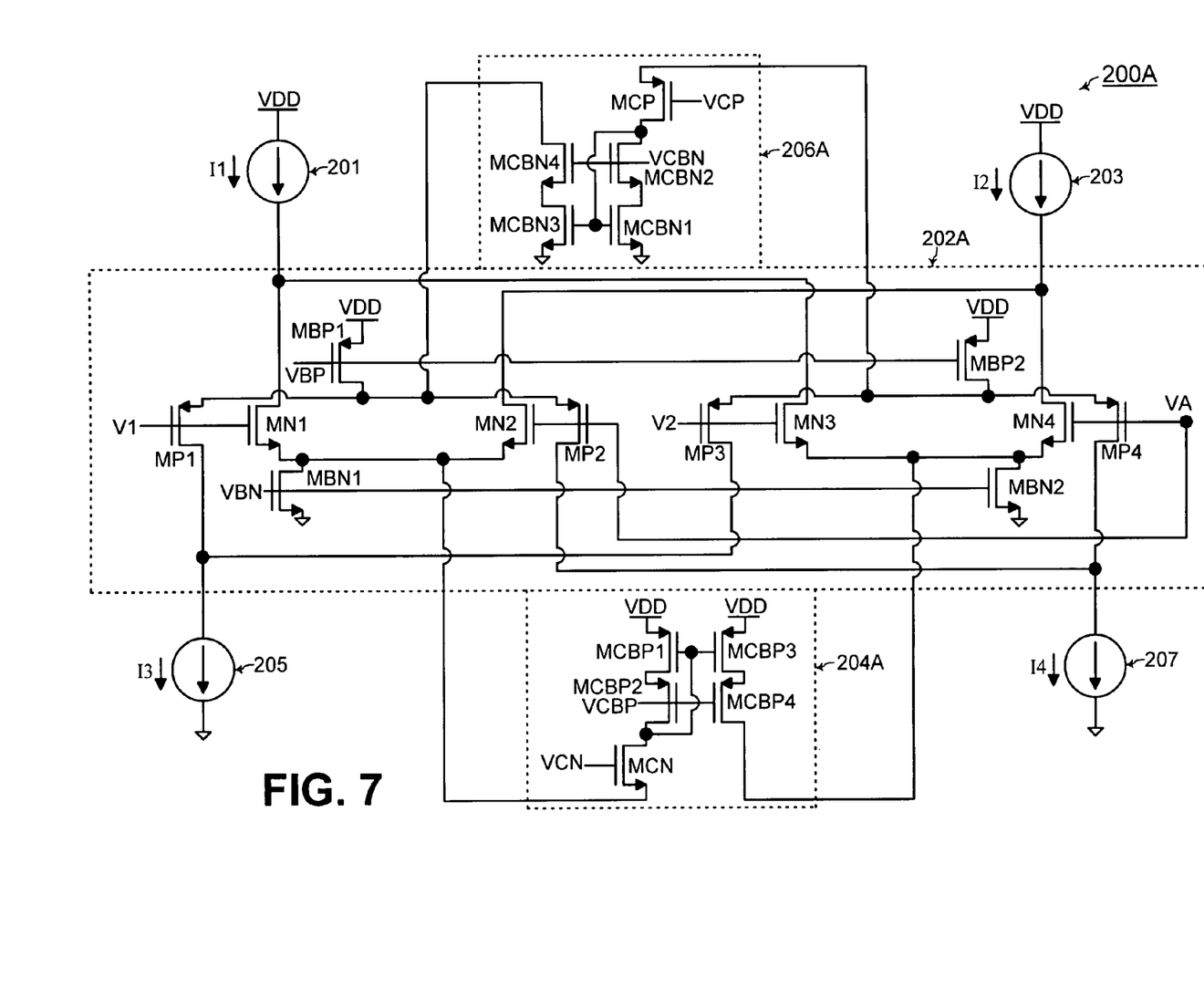
FIG. 7 shows an alternative circuit topology for offset compensators in an averaging circuit, according to another embodiment of the present invention.

The averaging circuit 200 of FIG. 5 or 6 is designed for the case that V1>V2. FIG. 7 illustrates an averaging circuit 200A that is designed for the case that V1<V2, according to another embodiment of the present invention. The averaging unit 202A of FIG. 7 is same as the averaging unit 202 of FIGS. 5 and 6.

However, a first offset compensator 204A of FIG. 7 is flipped from the first offset compensator 204 of FIGS. 5 and 6. Thus, the compensating NMOSFET MCN in FIG. 7 is coupled to the sources of the first and second NMOSFETs MN1 and MN2 while the drain of the cascode bias PMOSFET MCBP4 is coupled to the sources of the third and fourth NMOSFETs MN3 and MN4.

Similarly, the second offset compensator 206A of FIG. 7 is flipped from the second offset compensator 206 of FIGS. 5 and 6. Thus, the compensating PMOSFET MCP in FIG. 7 is coupled to the sources of the third and fourth PMOSFETs MP3 and MP4 while the drain of the cascode bias NMOSFET MCBN4 is coupled to the sources of the first and second PMOSFETs MP1 and MP2.

In FIG. 7, when V1 is lower than the first predetermined bias voltage level VCN, the MOSFETs MCN, MCBP1, MCBP2, MCBP3, and MCBP4 of the first offset compensator 204A are turned on. In that case, the NMOSFETs MN1, MN2, MN3, and MN4 are turned off such that the averaging circuit 200A depends on operation of the PMOSFETs MP1, MP2, MP3, MP4, MBP1 and MBP2 with the offset to the averaging signal VA being prevented.

Furthermore in FIG. 7, when V2 is higher than the second predetermined bias voltage level VCP, the MOSFETs MCP, MCBN1, MCBN2, MCBN3, and MCBN4 of the second offset compensator 206A are turned on. In that case, the PMOS- FETs MP1, MP2, MP3, and MP4 are turned off such that the averaging circuit 200A depends on operation of the NMOSFETs MN1, MN2, MN3, MN4, MBN1 and MBN2 with the offset to the averaging signal VA being prevented.

Figure 8:
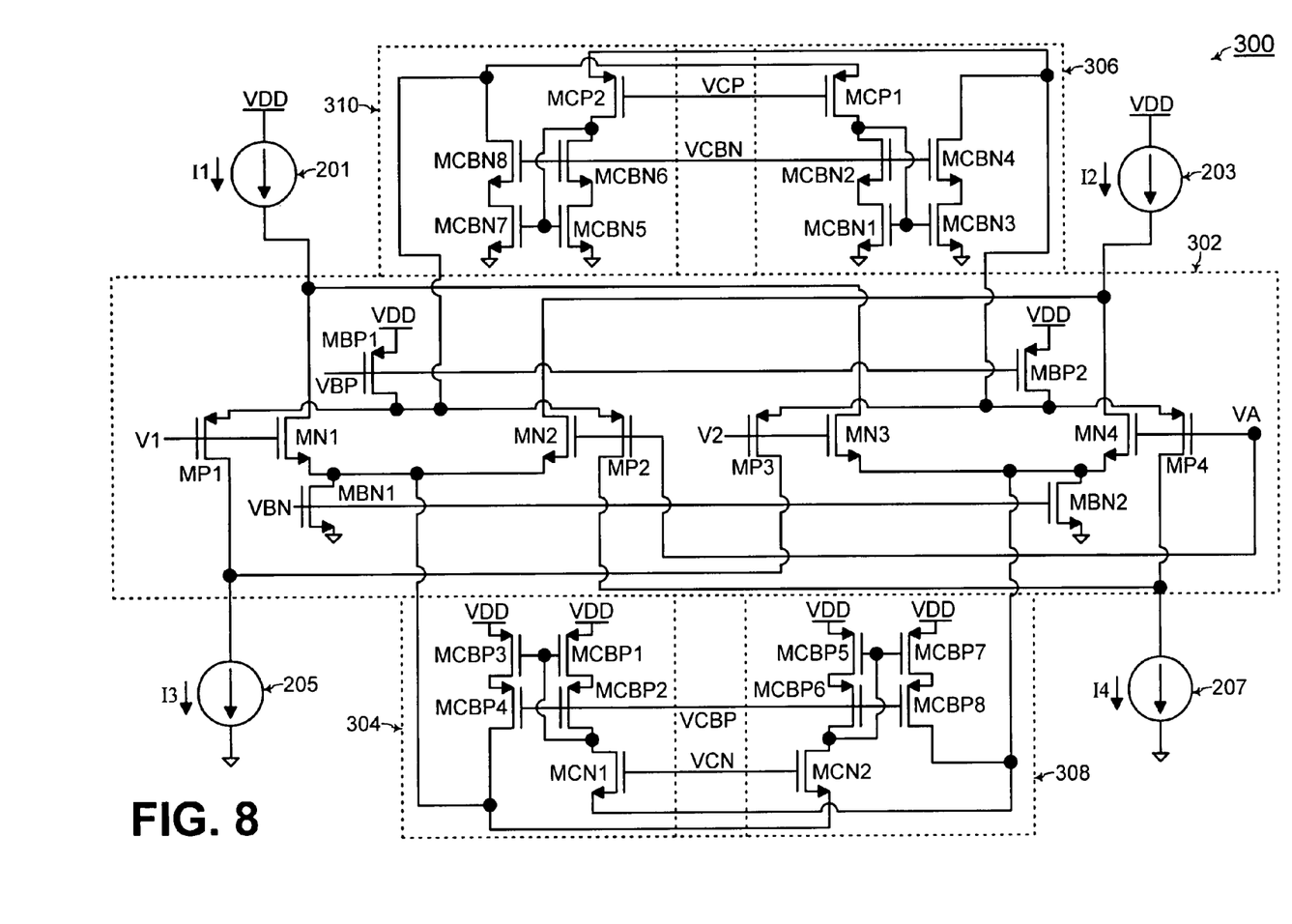
FIG. 8 shows a circuit diagram of an averaging circuit with more numerous offset compensators, according to another embodiment of the present invention.

FIG. 8 shows a circuit diagram of an averaging circuit 300 that operates when V1≧V2 or V1≦V2. The averaging circuit 300 includes an averaging unit 302 that is same as the averaging unit 202 of FIG. 5. In addition, the averaging circuit 300 includes a first offset compensator 304 that is same as the first offset compensator 204 of FIG. 5 and includes a second offset compensator 306 that is same as the second offset compensator 206 of FIG. 5.

Furthermore, the averaging circuit 300 of FIG. 8 includes a third offset compensator 308 that is similar to the first offset compensator 204A of FIG. 7. Thus, the third offset compensator 308 includes MOSFETs MCN2, MCBP5, MCBP6, MCBP7, and MCBP8 that have a flip configuration of the MOSFETs MCN1, MCBP1, MCBP2, MCBP3, and MCBP4 of the first offset compensator 304.

Similarly, the averaging circuit 300 of FIG. 8 includes a fourth offset compensator 310 that is similar to the second offset compensator 206A of FIG. 7. Thus, the fourth offset compensator 310 includes MOSFETs MCP2, MCBN5, MCBN6, MCBN7, and MCBN8 that have a flip configuration of the MOSFETs MCP1, MCBN1, MCBN2, MCBN3, and MCBN4 of the second offset compensator 306.

The MOSFETs MCN1, MCBP1, MCBP2, MCBP3, and MCBP4 of the first offset compensator 304 in FIG. 8 become conductive when the second input signal V2 is lower than the first predetermined bias voltage level VCN to prevent offset to the average signal VA, as described herein in reference to FIG. 5. The MOSFETs MCP1, MCBN1, MCBN2, MCBN3, and MCBN4 of the second offset compensator 306 in FIG. 8 become conductive when the first input signal V1 is greater than the second predetermined bias voltage level VCP to prevent offset to the average signal VA, as described herein in reference to FIG. 6.

The MOSFETs MCN2, MCBP5, MCBP6, MCBP7, and MCBP8 of the third offset compensator 308 in FIG. 8 become conductive when the first input signal V1 is lower than the first predetermined bias voltage level VCN to prevent offset to the average signal VA, as described herein in reference to FIG. 7. The MOSFETs MCP2, MCBN5, MCBN6, MCBN7, and MCBN8 of the fourth offset compensator 310 becomes conductive when the second input signal V2 is higher than the second predetermined bias voltage level VCP to prevent offset to the average signal VA, as described herein in reference to FIG. 7.

Figure 9:
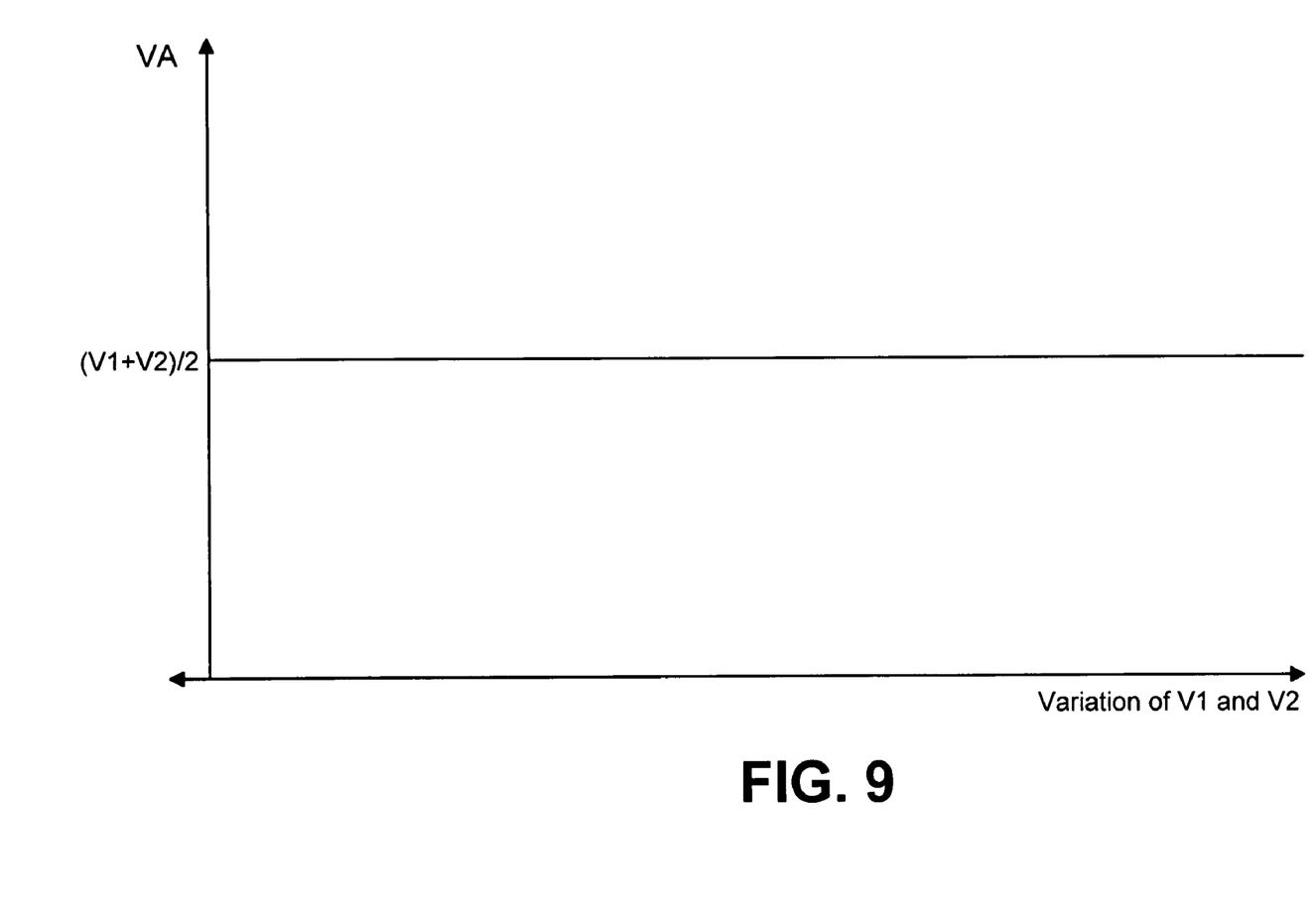
FIG. 9 shows a voltage diagram for illustrating elimination of offset in an average signal for the averaging circuit of FIG. 8, according to another embodiment of the present invention.

In this manner, FIG. 9 shows a graph of the average signal VA with variation of a first or second input signal V1 or V2 for the averaging circuit 300 of FIG. 8. Note that the average signal VA does not have any offset with variation of a first or second input signal V1 or V2. The offset compensators 304, 306, 308, and 310 conduct bias currents away from the averaging unit 302 when any of the input signals V1 and V2 is too low or too high as defined by the predetermined voltages VCP and VCN for preventing offset to the average signal VA.

The foregoing is by way of example only and is not intended to be limiting. For example, any number of elements as illustrated and described herein is by way of example. The present invention is limited only as defined in the following claims and equivalents thereof.

The present invention may be practiced when the inputs signals V1 and V2 and the average signal VA are DC voltages. Alternatively, the present invention may also be practiced when the input signals V1 and V2 and the average signal VA are time varying signals.

The invention claimed is:

1. An averaging circuit comprising:
   an averaging unit for generating an average signal from first and second input signals; and
   an offset compensating unit coupled to the averaging unit for conducting away a bias current from the averaging unit for preventing an offset in the average signal,
   wherein the averaging unit is a rail-to-rail averaging unit including:
   a first set of field effect transistors having gates with the first input signal applied thereon;
   a second set of field effect transistors having gates with the second input signal applied thereon; and
   a third set of field effect transistors having gates with the average signal generated thereon,
   and wherein the offset compensating unit includes:
   a first offset compensator that conducts a first bias current away from the third set of field effect transistors when the first input signal is less than a first predetermined level for preventing a positive offset in the average signal; and
   a second offset compensator that conducts a second bias current away from the third set of field effect transistors when the second input signal is higher than a second predetermined level for preventing a negative offset in the average signal.

2. The averaging circuit of claim 1, wherein the offset compensating unit includes:
   a third offset compensator that conducts the first bias current away from the third set of field effect transistors when the second input signal is less than the first predetermined level for preventing a positive offset in the average signal; and
   a fourth offset compensator that conducts the second bias current away from the third set of field effect transistors when the first input signal is higher than the second predetermined level for preventing a negative offset in the average signal.

3. The averaging circuit of claim 1, wherein the first set of field effect transistors includes:
   a first input NMOSFET (N-channel metal oxide field effect transistor) coupled between a first N-type current source and a first bias NMOSFET; and
   a first input PMOSFET (P-channel metal oxide field effect transistor) coupled between a first P-type current source and a first bias PMOSFET;
   wherein the first input signal is applied on the gates of the first input NMOSFET and PMOSFET;
   and wherein the second set of field effect transistors includes:
   a second input NMOSFET coupled between the first N-type current source and a second bias NMOSFET; and
   a second input PMOSFET coupled between the first P-type current source and a second bias PMOSFET;
   wherein the second input signal is applied on the gates of the second input NMOSFET and PMOSFET.

4. The averaging circuit of claim 3, wherein the third set of field effect transistors includes:
   a first output NMOSFET coupled between a second N-type current source and the first bias NMOSFET;
   a first output PMOSFET coupled between a second P-type current source and the first bias PMOSFET;
   a second output NMOSFET coupled between the second N-type current source and the second bias NMOSFET; and a second output PMOSFET coupled between the second P-type current source and the second bias PMOSFET, wherein the average signal is generated at the gates of the first and second output NMOSFETs and PMOSFETs, and wherein the first and second N-type current sources each generate a same first current level, and wherein the first and second P-type current sources each generate a same second current level.

5. The averaging circuit of claim 4, wherein the first offset compensator includes:

a compensating NMOSFET having a gate with a voltage of the first predetermined level applied thereon, and being coupled to the second bias NMOSFET; and a first current mirror coupled between the compensating NMOSFET and the first bias NMOSFET;

wherein when the second input signal is lower than the first predetermined level, the compensating NMOSFET and the first current mirror turn on for conducting currents through the first and second bias NMOSFETs with the first and second input and output NMOSFETs being turned off.

6. The averaging circuit of claim 5, wherein the first current mirror is a diode-connected cascode current mirror.

7. The averaging circuit of claim 5, wherein the first predetermined level VCN satisfies a following relationship:

$$VCN > [sqrt(2*L*Ibn/(k'*W))] + \Delta nb + Vth,n$$

with sqrt being a square root function, L being a length of the compensating NMOSFET, Ibn being a current through the second bias NMOSFET, k' being a mobility capacitance parameter of the compensating NMOSFET, W being a width of the compensating NMOSFET, $\Delta nb$ being a saturation voltage of the second bias NMOSFET, and Vth,n being a threshold voltage of the compensating NMOSFET.

8. The averaging circuit of claim 7, wherein sources of the first and second bias NMOSFETs have the low supply voltage applied thereon.

9. The averaging circuit of claim 4, wherein the second offset compensator includes:

a compensating PMOSFET having a gate with a voltage of the second predetermined level applied thereon, and being coupled to the first bias PMOSFET; and a second current mirror coupled between the compensating PMOSFET and the second bias PMOSFET;

wherein when the first input signal is higher than the second predetermined level, the compensating PMOSFET and the second current mirror turn on for conducting currents through the first and second bias PMOSFETs with the first and second input and output PMOSFETs being turned off.

10. The averaging circuit of claim 9, wherein the second current mirror is a diode-connected cascode current mirror.

11. The averaging circuit of claim 9, wherein the second predetermined level VCP satisfies a following relationship:

$$VCP < VDD - \Delta pb - |Vth,p| - [sqrt(2*L*Ibp/(k'*W))]$$

with sqrt being a square root function, VDD being the high power voltage applied on the first bias PMOSFET, L being a length of the compensating PMOSFET, Ibp being a current through the first bias PMOSFET, k' being a mobility capacitance parameter of the compensating PMOSFET, W being a width of the compensating PMOSFET, $\Delta pb$ being a saturation voltage of the first bias PMOSFET, and Vth,p being a threshold voltage of the compensating PMOSFET.

12. The averaging circuit of claim 11, wherein sources of the first and second bias PMOSFETs have the high supply voltage VDD applied thereon.

13. The averaging circuit of claim 4, wherein the first and second input NMOSFETs are matched, and wherein the first and second input PMOSFETs are matched, and wherein the first and second output NMOSFETs are matched, and wherein the first and second output PMOSFETs are matched, and wherein the first and second bias NMOSFETs are matched, and wherein the first and second bias PMOSFETs are matched.

14. The averaging circuit of claim 1, wherein the average signal is a first coefficient times the first input signal plus a second coefficient times the second input signal.

15. The averaging circuit of claim 1, wherein the average signal is about ½ times the first input signal plus ½ times the second input signal.

16. The averaging circuit of claim 1, wherein the first and second input signals, and the average signal are each a respective DC voltage.

17. An averaging circuit comprising:

means for generating an average signal from first and second input signals;

means for preventing an offset in the average signal;

means for conducting away a bias current from the means for generating such that the offset in the average signal is prevented;

means for preventing a positive offset in the average signal when the first input signal is less than a first predetermined level; and means for preventing a negative offset in the average signal when the second input signal is greater than a second predetermined level.

18. The averaging circuit of claim 17, wherein the average signal is about ½ times the first input signal plus ½ times the second input signal.

19. The averaging circuit of claim 17, wherein the first and second input signals, and the average signal are each a respective DC voltage.

20. A method for generating an average signal comprising:

applying a first input signal on gates of a first set of field effect transistors;

applying a second input signal on gates of a second set of field effect transistors; and generating the average signal on gates of a third set of field effect transistors from said first and second input signals; and preventing an offset in the average signal when at least one of the first and second input signals is outside of a predetermined range by conducting away a bias current from the third set of field effect transistors such that the offset in the average signal is prevented.

21. The method of claim 20, further comprising:

preventing a positive offset in the average signal when at least one of the first and second input signals is less than a first predetermined level; and preventing a negative offset in the average signal when at least one of the first and second input signals is greater than a second predetermined level.

22. The method of claim 20, wherein the average signal is a first coefficient times the first input signal plus a second coefficient times the second input signal.

23. The method of claim 20, wherein the average signal is about ½ times the first input signal plus ½ times the second input signal.

24. The method of claim 20, wherein the first and second input signals, and the average signal are each a respective DC voltage.

* * * * *